(12) United States Patent
Chu et al.

(10) Patent No.: US 11,979,130 B2
(45) Date of Patent: May 7, 2024

(54) TRANSMITTER CIRCUIT

(71) Applicant: REALTEK SEMICONDUCTOR CORPORATION, Hsinchu (TW)

(72) Inventors: Hung-Chen Chu, Hsinchu (TW); Chien-Hui Tsai, Hsinchu (TW); Yung-Tai Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 18/115,787

(22) Filed: Mar. 1, 2023

(65) Prior Publication Data
US 2023/0291391 A1    Sep. 14, 2023

(30) Foreign Application Priority Data

Mar. 14, 2022 (TW) .................................. 111109253

(51) Int. Cl.
*H03K 17/567* (2006.01)
*H03H 11/28* (2006.01)
*H03K 17/58* (2006.01)

(52) U.S. Cl.
CPC ........... *H03H 11/28* (2013.01); *H03K 17/567* (2013.01); *H03K 17/58* (2013.01)

(58) Field of Classification Search
CPC .................................................. H03K 17/567
USPC ....................................................... 327/109
See application file for complete search history.

(56) References Cited

U.S. PATENT DOCUMENTS

| | | | | |
|---|---|---|---|---|
| 7,961,000 B1 * | 6/2011 | Gross | ................... | H04L 25/0278 326/82 |
| 7,990,178 B2 * | 8/2011 | Liu | ................ | H03K 19/018585 326/86 |
| 8,125,245 B2 * | 2/2012 | Flynn | ........................ | H03F 1/56 326/86 |
| 2012/0188007 A1 * | 7/2012 | Van Zyl | ................... | H05H 1/46 327/109 |
| 2023/0216460 A1 * | 7/2023 | Tsai | ........................ | H03F 3/195 330/260 |

* cited by examiner

*Primary Examiner* — Tomi Skibinski
(74) *Attorney, Agent, or Firm* — WPAT, P.C (57) ABSTRACT

A transmitter circuit is provided. The transmitter circuit has a first transmission node and a second transmission node and includes a first resistor, a second resistor, a third resistor, a fourth resistor, and a driving circuit. The driving circuit includes a first transistor group, a second transistor group, a third transistor group, and a fourth transistor group. The first resistor is coupled between a first output terminal and the first transmission node. The second resistor is coupled between a second output terminal and the second transmission node. The third resistor is coupled between a third output terminal and the first transmission node. The fourth resistor is coupled between a fourth output terminal and the second transmission node. The first, second, third, and fourth transistor groups are coupled to a first and a second reference voltages and electrically connected to the first, second, third, and fourth output terminals, respectively.

13 Claims, 7 Drawing Sheets

TRANSMITTER CIRCUIT

BACKGROUND OF THE INVENTION

1. Field of the Invention

The present invention generally relates to a transmitter circuit, and, more particularly, to impedance matching of the transmitter circuit.

2. Description of Related Art

Figure 1:
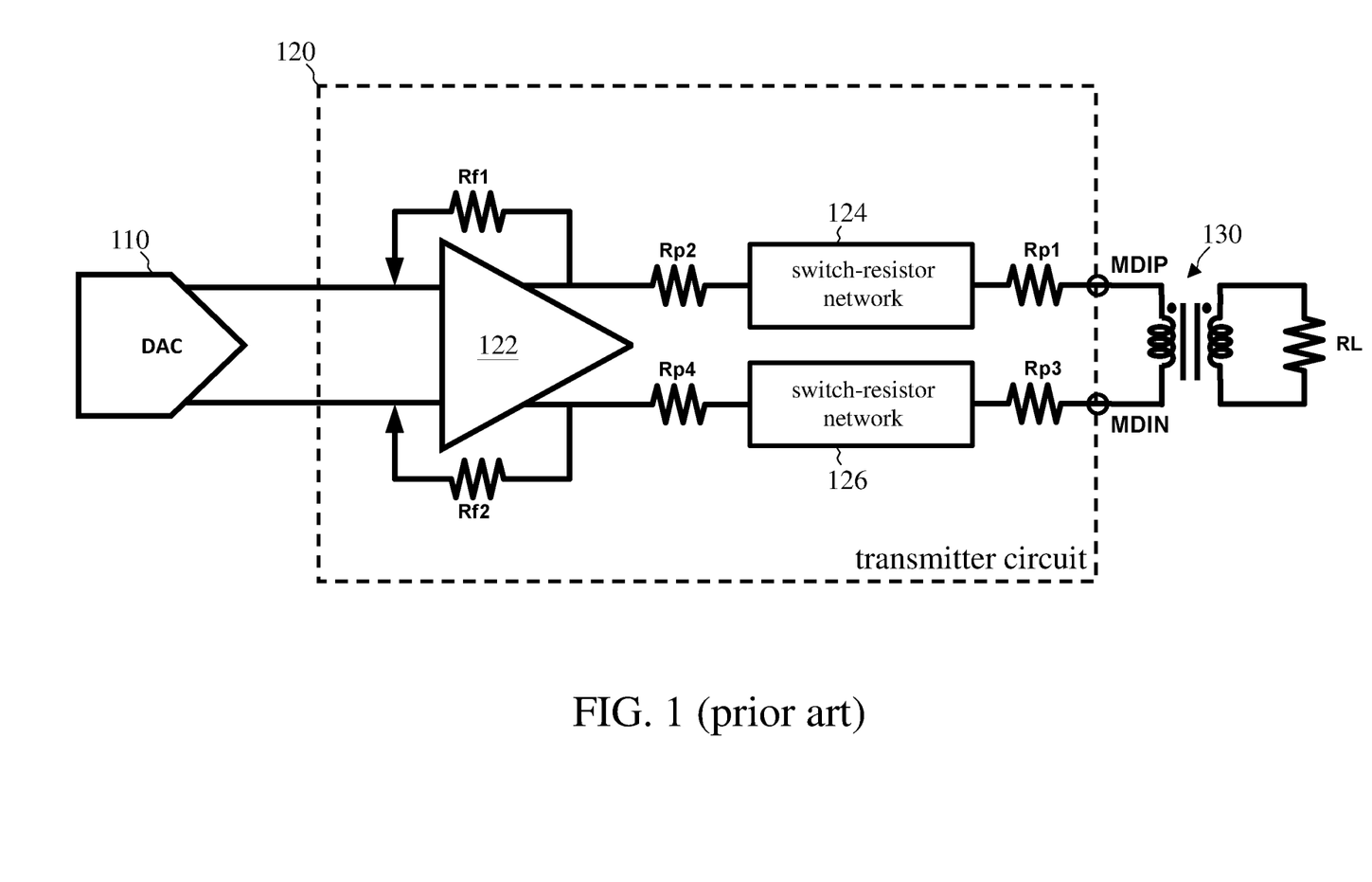
FIG. 1 shows a conventional transmitter circuit.

FIG. 1 shows a conventional transmitter circuit. The transmitter circuit 120 amplifies the output signal of the digital-to-analog converter (DAC) 110, and then the output signal is coupled to the load resistor RL through the transformer 130. The transmitter circuit 120 includes a driving circuit 122, a switch-resistor network 124, a switch-resistor network 126, a resistor Rp1, a resistor Rp2, a resistor Rp3, a resistor Rp4, a feedback resistor Rf1, and a feedback resistor Rf2. MDIP and MDIN are the transmission nodes of the transmitter circuit 120.

The characteristic impedance of the transmitter circuit 120 (consisting of the resistor Rp1, the resistor Rp2, the resistor Rp3, the resistor Rp4, the switch-resistor network 124, and the switch-resistor network 126) must match the load resistor RL. However, due to process variations, the resistance values of the resistor Rp_1, the resistor Rp2, the resistor Rp3, and the resistor Rp4 may not be the originally designed resistance values. The purpose of the switch-resistor network 124 and the switch-resistor network 126 is to correct the resistance value, thereby achieving impedance matching.

Figure 2:
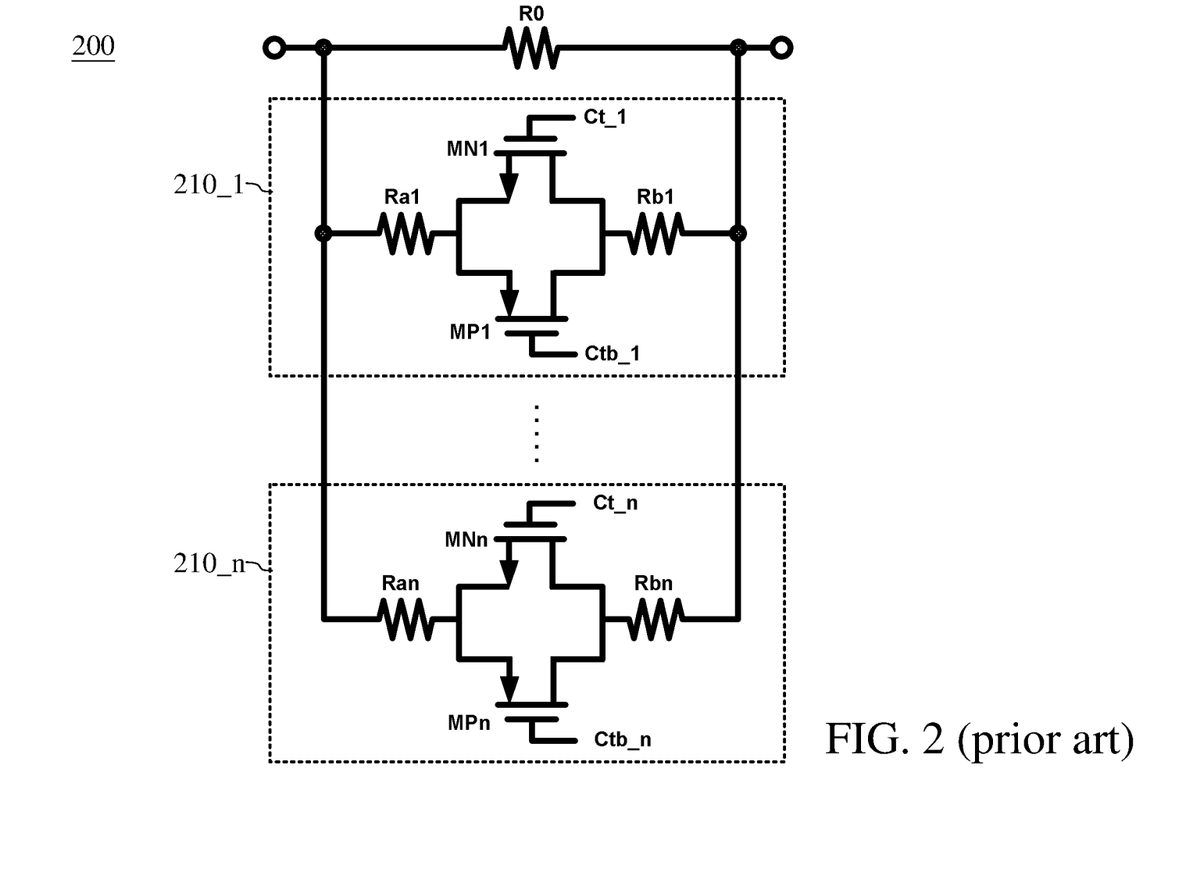
FIG. 2 is a circuit diagram of a conventional switch-resistor network.

Reference is made to FIG. 2, which is a circuit diagram of a switch-resistor network. The switch-resistor network 124 and the switch-resistor network 126 may be implemented with the switch-resistor network 200. The switch-resistor network 200 includes a resistor R0 and multiple resistor-switch units 210 (including a resistor-switch unit 210_1, ..., and a resistor-switch unit 210_n, n≥2). Taking the resistor-switch unit 210_n as an example, each resistor-switch unit 210 includes two resistors (Ran and Rbn) and two transistors (MNn and MPn). The two transistors form a transmission gate which is controlled by the control signal Ct_n and the control signal Ctb_n. By turning on or off the transmission gate, the equivalent resistance value of the switch-resistor network 200 can be adjusted to achieve the purpose of correcting the resistance value.

Because of there are large signal swings on the switch-resistor network 124 and the switch-resistor network 126, the transistors in FIG. 2 must be able to withstand high voltages. However, as transistors fabricated by the advanced manufacturing process cannot withstand high voltages, the conventional transmitter circuit 120 is not suitable for the advanced manufacturing process.

SUMMARY OF THE INVENTION

In view of the issues of the prior art, an object of the present invention is to provide a transmitter circuit, so as to make an improvement to the prior art.

According to one aspect of the present invention, a transmitter circuit is provided. The transmitter circuit has a first transmission node and a second transmission node and includes a first resistor, a second resistor, a third resistor, a fourth resistor, and a driving circuit. The driving circuit includes a first transistor group, a second transistor group, a third transistor group, and a fourth transistor group. The first resistor is coupled between a first output terminal and the first transmission node. The second resistor is coupled between a second output terminal and the second transmission node. The third resistor is coupled between a third output terminal and the first transmission node. The fourth resistor is coupled between a fourth output terminal and the second transmission node. The first transistor group is coupled to a first reference voltage and a second reference voltage and electrically connected to the first output terminal. The second transistor group is coupled to the first reference voltage and the second reference voltage and electrically connected to the second output terminal. The third transistor group is coupled to the first reference voltage and the second reference voltage and electrically connected to the third output terminal. The fourth transistor group is coupled to the first reference voltage and the second reference voltage and electrically connected to the fourth output terminal.

The transmitter circuit of the present invention achieves the purpose of impedance matching by providing multiple transistor groups and multiple resistors. In comparison with the prior art, the present invention is suitable for the advanced manufacturing process because the characteristic impedance is not corrected by means of resistors and a transmission gate that are connected in series.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a transmitter circuit. On account of that some or all elements of the transmitter circuit could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

In the following discussions, each transistor has a first terminal, a second terminal, and a control terminal. When the transistor is used as a switch, the first terminal and the second terminal of the transistor are two ends of the switch, and the switch is controlled to be turned on (transistor on) or turned off (transistor off) through the control terminal. For Metal-Oxide-Semiconductor Field-Effect Transistors (MOSFETs), the first terminal can be one of the source and the drain, the second terminal is the other of the source and the drain, and the control terminal is the gate. For bipolar junction transistors (BJTs), the first terminal can be one of the collector and the emitter, the second terminal is the other of the collector and the emitter, and the control terminal is the base.

Figure 3:
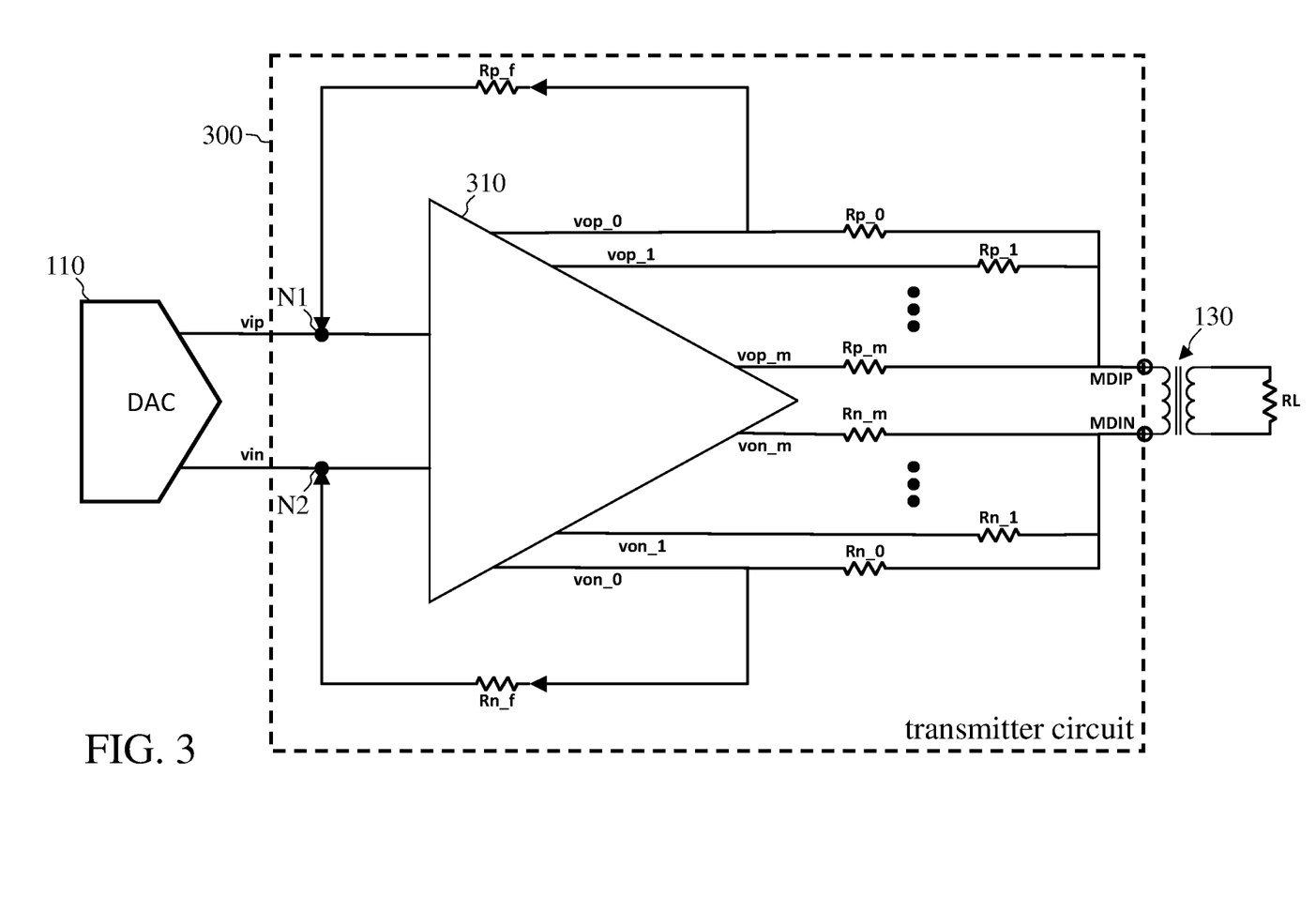
FIG. 3 is a functional block diagram of a transmitter circuit according to an embodiment of the present invention.

FIG. 3 is a functional block diagram of a transmitter circuit 300 according to an embodiment of the present invention. In one embodiment, the transmitter circuit 300 is, for example, an Ethernet transmitter circuit. The transmitter circuit 300 includes a driving circuit 310, a resistor Rp_0, a resistor Rp_1, a resistor Rp_m, a resistor Rn_0, a resistor Rn_1, a resistor Rn_m, a feedback resistor Rp_f, and a feedback resistor Rn_f. The transmitter circuit 300 receives the input signal vip and the input signal vin through the input terminal N1 and the input terminal N2, and is coupled to the transformer 130 through the transmission node MDIP and the transmission node MDIN. The input signal vip and the input signal vin are output signals of the DAC 110.

The driving circuit 310 includes multiple output terminals: an output terminal vop_0, an output terminal vop_1, ..., an output terminal vop_m, an output terminal von_0, an output terminal von_1, ..., and an output terminal von_m (m≥1). The resistor Rp_0 is coupled or electrically connected between the output terminal vop_0 and the transmission node MDIP; the resistor Rp_1 is coupled or electrically connected between the output terminal vop_1 and the transmission node MDIP; the resistor Rp_m is coupled or electrically connected between the output terminal vop_m and the transmission node MDIP; the resistor Rn_0 is coupled or electrically connected between the output terminal von_0 and the transmission node MDIN; the resistor Rn_1 is coupled or electrically connected between the output terminal von_1 and the transmission node MDIN; the resistor Rn_m is coupled or electrically connected between the output terminal von_m and the transmission node MDIN. The feedback resistor Rp_f is coupled or electrically connected between the output terminal vop_0 and the input terminal N1, and the feedback resistor Rn_f is coupled or electrically connected between the output terminal von_0 and the input terminal N2.

The present invention controls the number of resistors that are connected in series and/or parallel (i.e., correcting the resistance value) through controlling the configuration of the driving circuit 310, thereby achieving the purpose of impedance matching. The control of the configuration of the driving circuit 310 is detailed below with reference to FIG. 4 to FIG. 6.

Figure 4:
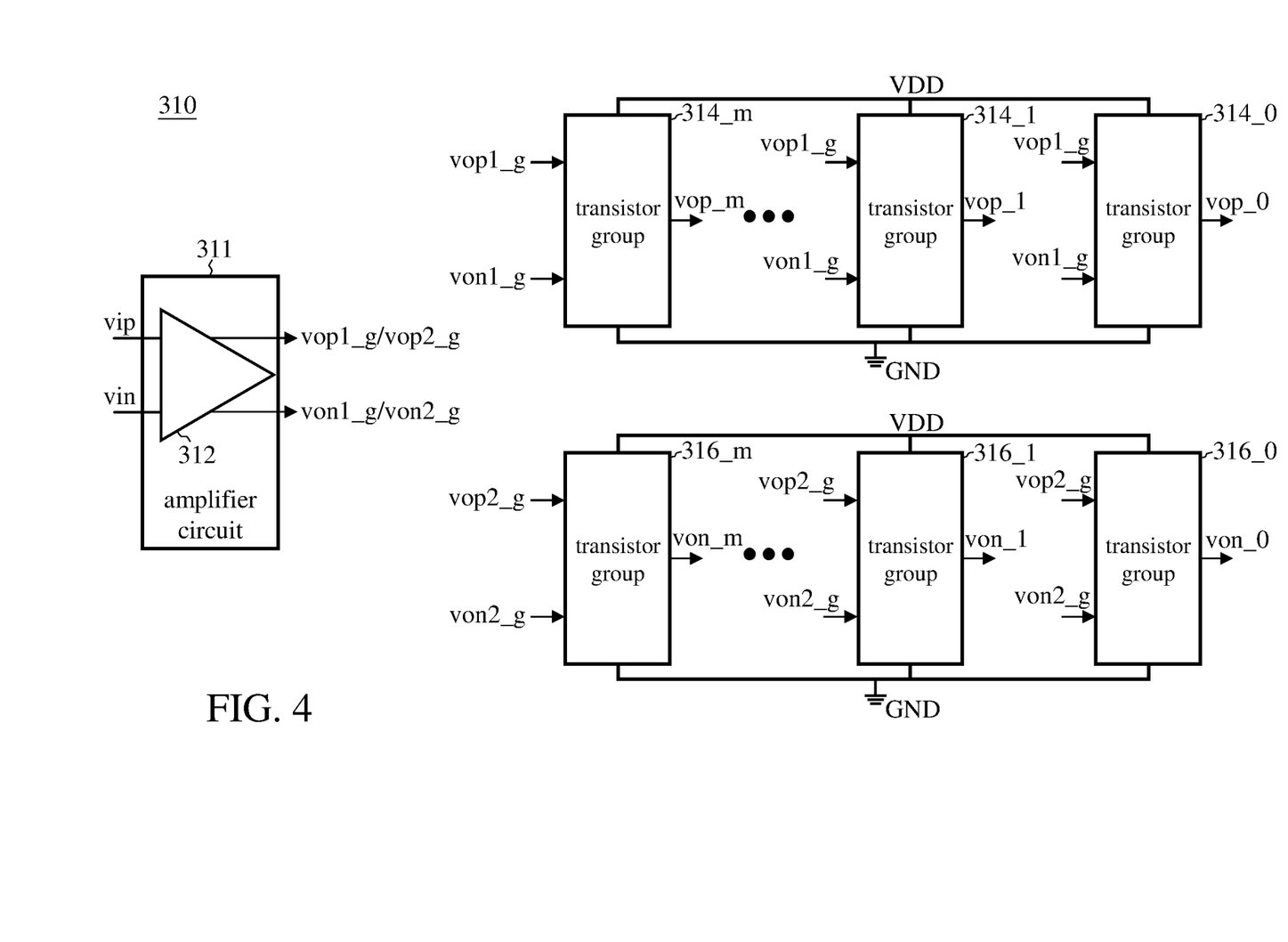
FIG. 4 shows a functional block diagram of a driving circuit according to an embodiment.

Reference is made to FIG. 4, which shows a functional block diagram of the driving circuit 310 according to an embodiment. The driving circuit 310 includes an amplifier circuit 311, multiple transistor groups 314 (including 314_0, 314_1, ..., 314_m) and multiple transistor groups 316 (including 316_0, 316_1, ..., 316_m). The amplifier circuit 311 includes an operational amplifier 312. The operational amplifier 312 receives the input signal vip and the input signal vin, and outputs the signal vop1_g, the signal vop2_g, the signal von1_g, and the signal von2_g. In one embodiment, the signal vop1_g and the signal vop2_g are a pair of differential signals; the signal von1_g and the signal von2_g are a pair of differential signals. Each transistor group 314 receives the signal vop1_g and the signal von1_g, and each transistor group 316 receives the signal vop2_g and the signal von2_g. The transistor group 314_0, the transistor group 314_1, the transistor group 314_m, the transistor group 316_0, the transistor group 316_1, and the transistor group 316_m are all coupled or electrically connected to a first reference voltage (e.g., a power supply voltage VDD) and the second reference voltage (e.g., the ground level GND, VDD>GND), and are respectively electrically connected to the output terminal vop_0, the output terminal vop_1, the output terminal vop_m, the output terminal von_0, the output terminal von_1, and the output terminal von_m. In other words, the output terminal vop_0, the output terminal vop_1, the output terminal vop_m, the output terminal von_0, the output terminal von_1, and the output terminal von_m are the output terminals of the transistor group 314_0, the transistor group 314_1, the transistor group 314_m, the transistor group 316_0, the transistor group 316_1, and the transistor group 316_m, respectively.

Each transistor group can be enabled (i.e., turned on) or disabled (i.e., turned off). When a transistor group is enabled, its corresponding resistor (i.e., the resistor coupled or electrically connected to the output terminal of the transistor group) becomes a part of the characteristic impedance of the transmitter circuit 300 (i.e., the resistance value of the resistor affects the characteristic impedance); when a transistor group is disabled, its corresponding resistor is not a part of the characteristic impedance of the transmitter circuit 300 (i.e., the resistance value of the resistor does not affect the characteristic impedance). For example, when the transistor group 314_1 is enabled, the resistor Rp_1 participates in the correction of the resistance value (i.e., has an influence on the impedance matching).

Since the transistor group 314_0 and the transistor group 316_0 are respectively coupled or electrically connected to the feedback resistor Rp_f and the feedback resistor Rn_f, the transistor group 314_0 and the transistor group 316_0 are always turned on.

In some embodiments, a pair of transistor groups (314_$k$ and 316_$k$, where 1≤k≤m) are enabled or disabled at the same time. When the transistor group 314_$k$ and the transistor group 316_$k$ are enabled at the same time, a virtual ground is formed between the output terminal vop_k and the output terminal von_k. For example (referring to FIG. 3 and FIG. 4 at the same time), when the transistor group 314_0, the transistor group 316_0, the transistor group 314_1, and the transistor group 316_1 are enabled, and the remaining transistor groups are not enabled, the characteristic impedance of the transmitter circuit 300 is equal to (Rp_0+Rn_0)// (Rp_1+Rn_1) (where "//" means parallel connection).

In some embodiments (for illustrative purposes only and not for limiting the scope of the present invention), the resistance value of the resistor Rp_0 is equal to the resistance value of the resistor Rn_0, the resistance value of the resistor Rp_1 is equal to the resistance value of the resistor Rn_1, ..., and the resistance value of the resistor Rp_m is equal to the resistance value of the resistor Rn_m.

In some embodiments (for illustrative purposes only and not for limiting the scope of the present invention), the resistance value of the resistor Rp_0 and the resistance value of the resistor Rn_0 are both 2/32 kilo-ohms, and the resistance value of the resistor Rp_k and the resistance value of the resistor Rn_k are both $2/2^{k-1}$ kilo-ohms (where 1≤k≤m).

Figure 5:
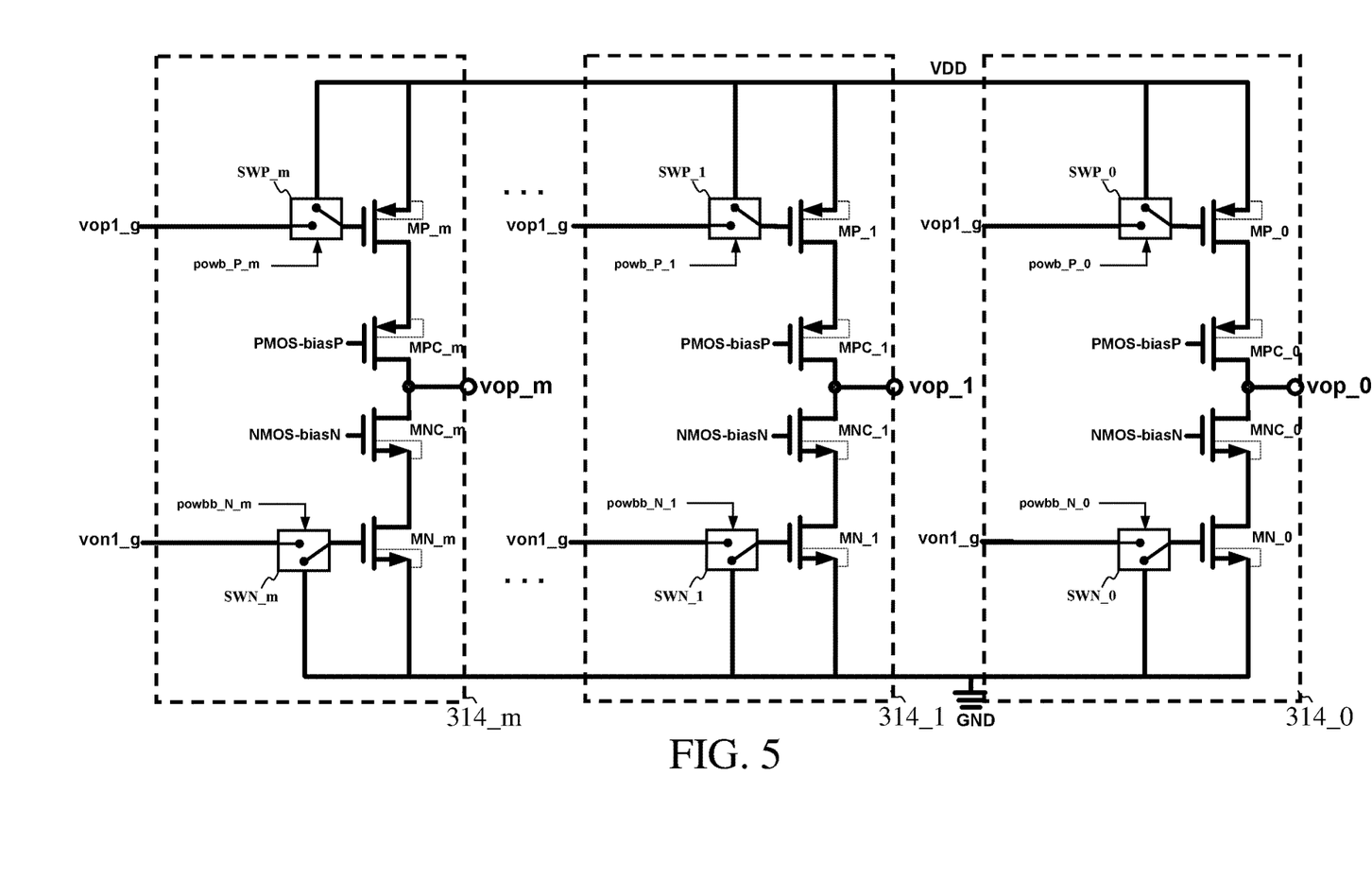
FIG. 5 shows the internal circuit of multiple transistor groups.

Reference is made to FIG. 5, which shows the internal circuits of multiple transistor groups 314. Each transistor group 314 includes 4 transistors and 2 switches. Taking the transistor group 314_0 as an example, the transistor group 314_0 includes a transistor MP_0, a transistor MN_0, a transistor MPC_0, a transistor MNC_0, a switch SWP_0, and a switch SWN_0. The source of the transistor MP_0 is coupled or electrically connected to the first reference voltage; the drain of the transistor MP_0 is coupled or electrically connected to the output terminal vop_0; the gate of the transistor MP_0 is coupled or electrically connected to the switch SWP_0. The source of the transistor MN_0 is coupled or electrically connected to the second reference voltage; the drain of the transistor MN_0 is coupled or electrically connected to the output terminal vop_0; the gate of the transistor MN_0 is coupled or electrically connected to the switch SWN_0. The source of the transistor MPC_0 is coupled or electrically connected to the drain of the transistor MP_0; the drain of the transistor MPC_0 is coupled or electrically connected to the output terminal vop_0; the gate of the transistor MPC_0 receives the voltage PMOS-biasP. The source of the transistor MNC_0 is coupled or electrically connected to the drain of the transistor MN_0; the drain of the transistor MNC_0 is coupled or electrically connected to the output terminal vop_0; the gate of the transistor MNC_0 receives the voltage NMOS-biasN. The switch SWP_0 is controlled by the control signal powb_P_0. When the control signal powb_P_0 is at a first level, the gate of the transistor MP_0 receives the signal vop1_g (i.e., the gate is coupled or electrically connected to the operational amplifier 312); when the control signal powb_P_0 is at a second level, the gate of the transistor MP_0 receives the first reference voltage (i.e., the gate is coupled or electrically connected to the power supply voltage VDD). The switch SWN_0 is controlled by the control signal powbb_N_0. When the control signal powbb_N_0 is at the first level, the gate of the transistor MN_0 receives the signal von1_g (i.e., the gate is coupled or electrically connected to the operational amplifier 312); when the control signal powbb_N_0 is at the second level, the gate of the transistor MN_0 receives the second reference voltage (e.g., the ground level GND).

When the gate of the transistor MP_0 receives the signal vop1_g and the gate of the transistor MN_0 receives the signal von1_g, the transistor group 314_0 is enabled; when the gate of transistor MP_0 receives the first reference voltage and the gate of transistor MN_0 receives the second reference voltage, the transistor group 314_0 is disabled.

The transistor MPC_0 and the transistor MNC_0 are protective transistors that prevent the transistor MP_0 and the transistor MN_0 from being subjected to overly high voltages. The voltage PMOS-biasP is the bias voltage of the transistor MPC_0, and the voltage NMOS-biasN is the bias voltage of the transistor MNC_0. In some embodiments, the transistor MPC_0 and the transistor MNC_0 may be omitted if the transistor MP_0 and the transistor MN_0 are not subjected to overly high voltages.

The transistor group 314_1 includes a transistor MP_1, a transistor MN_1, a transistor MPC_1, a transistor MNC_1, a switch SWP_1, and a switch SWN_1. The switch SWP_1 and the switch SWN_1 are controlled by the control signal powb_P_1 and the control signal powbb_N_1, respectively. The transistor group 314_m includes a transistor MP_m, a transistor MN_m, a transistor MPC_m, a transistor MNC_m, a switch SWP_m, and a switch SWN_m. The switch SWP_m and the switch SWN_m are controlled by the control signal powb_P_m and the control signal powbb_N_m, respectively. The transistor group 314_1 and the transistor group 314_m are the same as the transistor group 314_0 in structure; therefore, similar discussions about the transistor group 314_1 and the transistor group 314_m are omitted for brevity.

The structure of the transistor group 316 is the same as that of the transistor group 314. People having ordinary skill in the art can implement the transistor group 316 by referring to FIG. 5, and the details are omitted for brevity.

Figure 6:
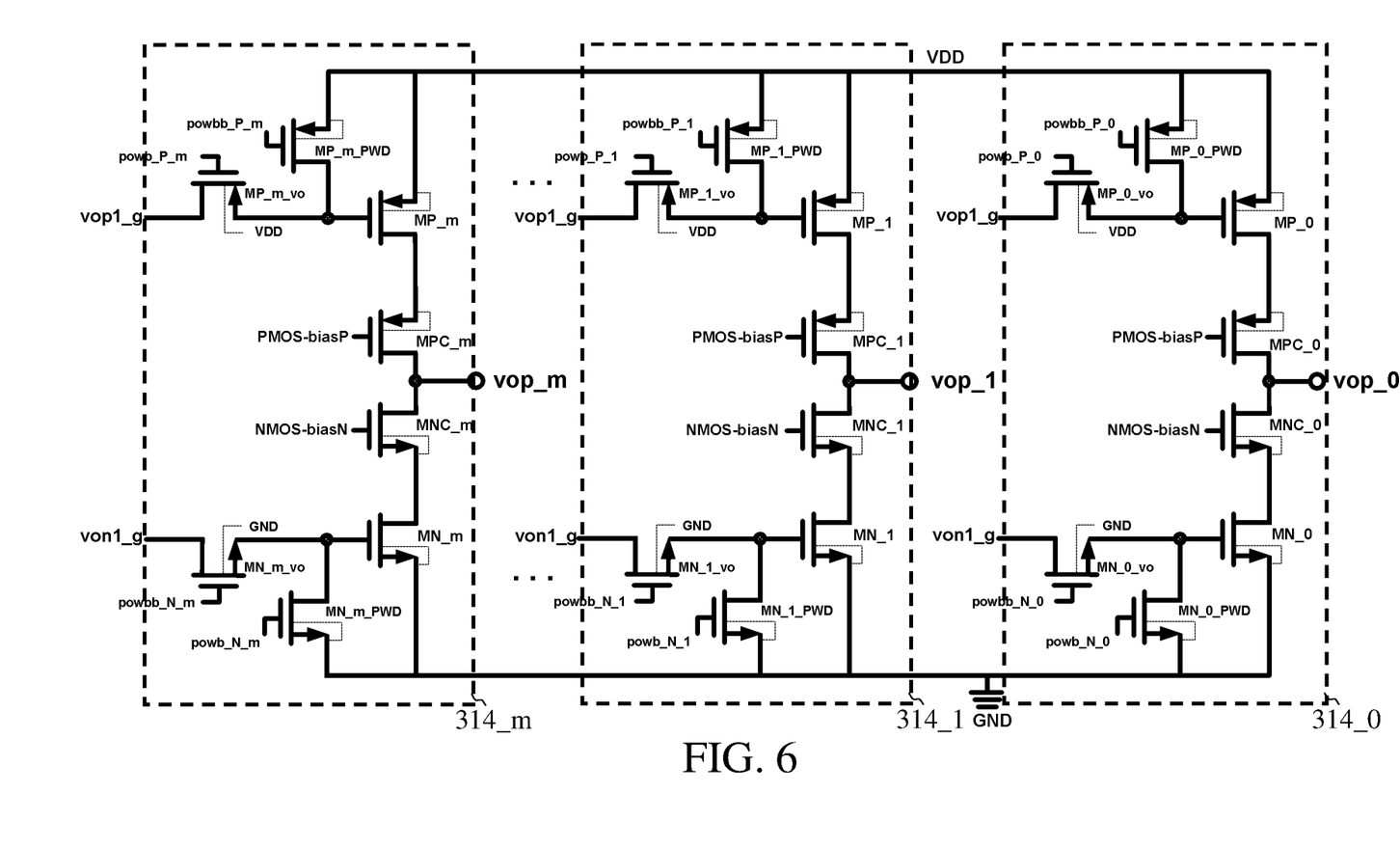
FIG. 6 shows the internal circuit of multiple transistor groups.

Reference is made to FIG. 6, which shows the internal circuits of multiple transistor groups 314. The implementation details of the switches in FIG. 5 can be known from FIG. 6. The switch SWP_0 includes a transistor MP_0_vo and a transistor MP_0_PWD. The switch SWN_0 includes a transistor MN_0_vo and a transistor MN_0_PWD. The switch SWP_1 includes a transistor MP_1_vo and a transistor MP_1_PWD. The switch SWN_1 includes a transistor MN_1_vo and a transistor MN_1_PWD. The switch SWP_m includes a transistor MP_m_vo and a transistor MP_m_PWD. The switch SWN_m includes a transistor MN_m_vo and a transistor MN_m_PWD.

Take the switch SWP_0 as an example. The source of the transistor MP_0_vo is coupled or electrically connected to the gate of the transistor MP_0; the drain of the transistor MP_0_vo receives the signal vop1_g; the gate of the transistor MP_0_vo receives the control signal powb_P_0. The source of the transistor MP_0_PWD is coupled or electrically connected to the first reference voltage; the drain of the transistor MP_0_PWD is coupled or electrically connected to the gate of the transistor MP_0; the gate of the transistor MP_0_PWD receives the control signal powbb_P_0. The control signal powb_P_0 and the control signal powbb_P_0 are each other's inverted signals. When the control signal powb_P_0 is at a high level, the transistor MP_0_vo is turned off and the transistor MP_0_PWD is turned on, causing the transistor MP_0 to be turned off. When the control signal powb_P_0 is at a low level, the transistor MP_0_vo is turned on and the transistor MP_0_PWD is turned off, causing the transistor MP_0 to be turned on.

People having ordinary skill in the art can know the implementation details of other switches from the above discussions about the switch SWP_0; therefore, the details are omitted herein for brevity. The control signal powbb_N_0 and the control signal powb_N_0 are each other's inverted signals. The control signal powb_P_1 and the control signal powbb_P_1 are each other's inverted signals. The control signal powbb_N_1 and the control signal powb_N_1 are each other's inverted signals. The control signal powb_P_m and the control signal powbb_P_m are each other's inverted signals. The control signal powbb_N_m and the control signal powb_N_m are each other's inverted signals.

FIG. 6 is for illustrative purposes only; the implementation of the switches in FIG. 5 is not limited to FIG. 6.

Figure 7:
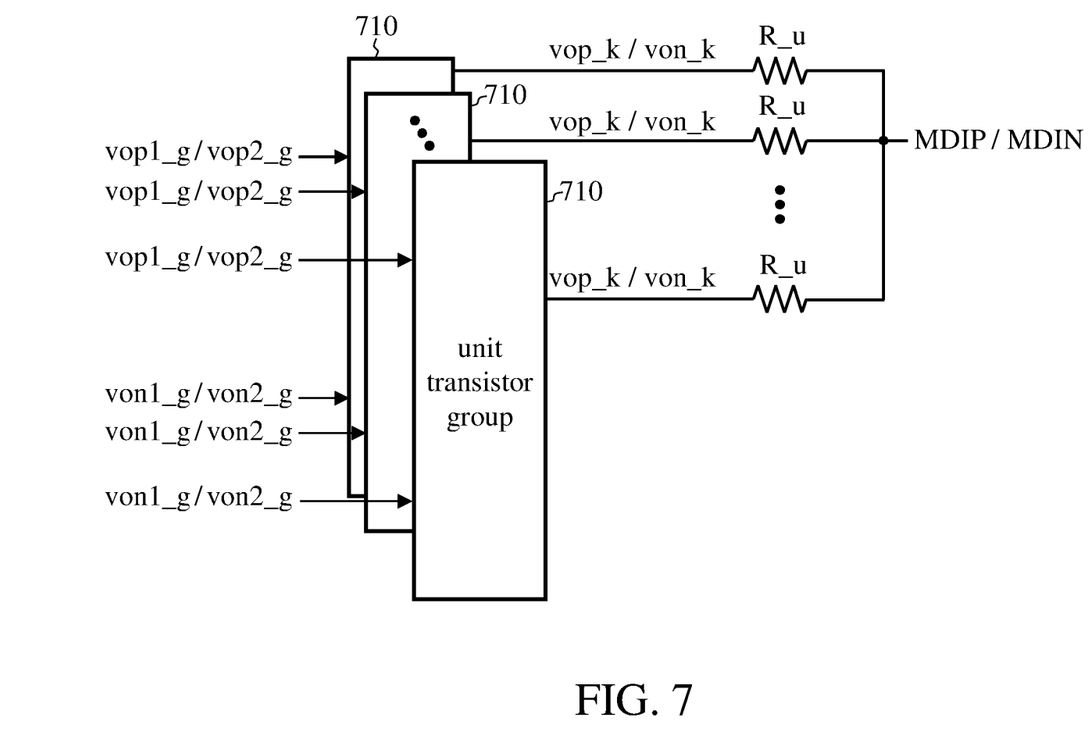
FIG. 7 shows the coupling of transistor groups to resistors according to an embodiment of the present invention.

Reference is made to FIG. 7, which shows the coupling of the transistor group to resistors according to an embodiment of the present invention. The transistor group 314_k (or the transistor group 316_k, where 0≤k≤m) includes multiple unit transistor groups 710, each unit transistor group 710 is coupled or electrically connected to a unit resistor R_u. The unit transistor groups 710 are connected in parallel, and the unit resistors R_u are connected in parallel.

In some embodiments (for illustrative purposes only and not for limiting the scope of the present invention), the transistor group 314_$k$ and the transistor group 316_$k$ each include $2^k$ unit transistor groups 710, and the resistor Rp_k and the resistor Rn_k (i.e., the resistors respectively coupled or electrically connected to the output terminal vop_k and the output terminal von_k) each include $2^k$ unit resistors R_u. This design is good for the correction of the entire resistance value (i.e., good for impedance matching) of the transmitter circuit 300 because each transistor group 314_$k$ and transistor group 316_$k$ are made up of the unit transistor groups 710, and each resistor Rp_k and resistor Rn_k are made up of the unit resistors R_u, which means that the influence of the manufacturing process on each component (the transistor group 314_$k$, the transistor group 316_$k$, the resistor Rp_k, or the resistor Rn_k) is proportional to the number of unit transistor groups 710 or the number of unit resistors R_u contained in that component.

Note that the dashed lines on the transistors in FIG. 5 and FIG. 6 shows how the bases of the transistors are biased. This, however, is for illustrative purposes only not for limiting the scope of the present invention. Other base biasing approaches are also within the scope of the present invention.

Note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A transmitter circuit having a first transmission node and a second transmission node, the transmitter circuit comprising:
    a first resistor coupled between a first output terminal and the first transmission node;
    a second resistor coupled between a second output terminal and the second transmission node;
    a third resistor coupled between a third output terminal and the first transmission node;
    a fourth resistor coupled between a fourth output terminal and the second transmission node; and
    a driving circuit, comprising:
        a first transistor group coupled to a first reference voltage and a second reference voltage and electrically connected to the first output terminal;
        a second transistor group coupled to the first reference voltage and the second reference voltage and electrically connected to the second output terminal;
        a third transistor group coupled to the first reference voltage and the second reference voltage and electrically connected to the third output terminal; and
        a fourth transistor group coupled to the first reference voltage and the second reference voltage and electrically connected to the fourth output terminal.

2. The transmitter circuit of claim 1 further comprising:
    an operational amplifier outputting a first signal, a second signal, a third signal, and a fourth signal;
    wherein the first transistor group and the third transistor group each receive the first signal and the second signal, and the second transistor group and the fourth transistor group each receive the third signal and the fourth signal.

3. The transmitter circuit of claim 2, wherein the first transistor group, the second transistor group, the third transistor group, and the fourth transistor group each comprise:
    a first transistor having a first source, a first drain, and a first gate, wherein the first source is coupled to the first reference voltage, the first drain is coupled to the first output terminal, the second output terminal, the third output terminal, or the fourth output terminal, and the first gate receives the first signal, the third signal, or the first reference voltage; and
    a second transistor having a second source, a second drain, and a second gate, wherein the second source is coupled to the second reference voltage, the second drain is coupled to the first output terminal, the second output terminal, the third output terminal, or the fourth output terminal, and the second gate receives the second signal, the fourth signal, or the second reference voltage.

4. The transmitter circuit of claim 3, wherein the first transistor group, the second transistor group, the third transistor group, and the fourth transistor group each further comprise:
    a first switch coupled to the first gate and configured to couple the first gate to the operational amplifier or the first reference voltage according to a first control signal; and
    a second switch coupled to the second gate and configured to couple the second gate to the operational amplifier or the second reference voltage according to a second control signal.

5. The transmitter circuit of claim 4, wherein the first switch and the second switch each comprise:
    a third transistor having a third source, a third drain, and a third gate, wherein the third source is coupled to the first gate or the second gate, the third drain receives the first signal, the second signal, the third signal, or the fourth signal, and the third gate receives the first control signal or the second control signal; and
    a fourth transistor having a fourth source, a fourth drain, and a fourth gate, wherein the fourth source is coupled to the first reference voltage or the second reference voltage, the fourth drain is coupled to the first gate or the second gate, and the fourth gate receives an inverted signal of the first control signal or an inverted signal of the second control signal.

6. The transmitter circuit of claim 3, wherein the first transistor group, the second transistor group, the third transistor group, and the fourth transistor group each further comprise:
    a third transistor having a third source, a third drain, and a third gate, wherein the third source is coupled to the first drain, the third drain is coupled to the first output terminal, the second output terminal, the third output terminal, or the fourth output terminal, and the third gate receives a voltage; and
    a fourth transistor having a fourth source, a fourth drain, and a fourth gate, wherein the fourth source is coupled to the second drain, the fourth drain is coupled to the first output terminal, the second output terminal, the third output terminal, or the fourth output terminal, and the fourth gate receives the voltage.

7. The transmitter circuit of claim 2, wherein the operational amplifier has a first input terminal and a second input terminal, the transmitter circuit further comprising:
    a first feedback resistor coupled between the first output terminal and the first input terminal; and a second feedback resistor coupled between the second output terminal and the second input terminal.

8. The transmitter circuit of claim 7, wherein the first transistor group and the second transistor group are always turned on.

9. The transmitter circuit of claim 2, wherein the first signal and the third signal form a first differential signal, and the second signal and the fourth signal form a second differential signal.

10. The transmitter circuit of claim 1, wherein the first resistor is formed by R unit resistors, and the first transistor group is formed by R unit transistor groups, R being a positive integer.

11. The transmitter circuit of claim 10, wherein the second resistor is formed by R unit resistors, and the second transistor group is formed by R unit transistor groups.

12. The transmitter circuit of claim 1, wherein a resistance value of the first resistor is equal to a resistance value of the second resistor, and a resistance value of the third resistor is equal to a resistance value of the fourth resistor.

13. The transmitter circuit of claim 12, wherein a resistance value of the first resistor is different from a resistance value of the third resistor.

\* \* \* \* \*